(12) United States Patent
Ohtsuka et al.

(10) Patent No.: US 7,564,072 B2
(45) Date of Patent: Jul. 21, 2009

(54) SEMICONDUCTOR DEVICE HAVING JUNCTION TERMINATION EXTENSION

(75) Inventors: Kenichi Ohtsuka, Tokyo (JP); Yoichiro Tarui, Tokyo (JP); Yoshinori Matsuno, Tokyo (JP); Kenichi Kuroda, Tokyo (JP); Hiroshi Sugimoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 252 days.

(21) Appl. No.: 11/142,322

(22) Filed: Jun. 2, 2005

(65) Prior Publication Data

US 2006/0118812 A1 Jun. 8, 2006

(30) Foreign Application Priority Data

Dec. 7, 2004 (JP) ............................. 2004-353757

(51) Int. Cl.
*H01L 29/74* (2006.01)
(52) U.S. Cl. ..................... 257/107; 123/648; 327/199; 327/438; 361/100; 361/205; 363/27; 388/917; 438/133; 257/E29.211
(58) Field of Classification Search ................. 257/107, 257/E29.211; 123/648; 327/199, 392, 438; 361/100, 205; 363/27; 388/917; 438/133
See application file for complete search history.

(56) References Cited

U.S. PATENT DOCUMENTS 4,927,772 A 5/1990 Arthur et al.

5,914,500 A * 6/1999 Bakowski et al. ............. 257/77
6,002,159 A * 12/1999 Bakowski et al. ........... 257/493
6,100,111 A * 8/2000 Konstantinov ............... 438/92
2003/0045045 A1* 3/2003 Singh ......................... 438/200

FOREIGN PATENT DOCUMENTS

EP 1071135 1/2001
JP 2003-303956 * 10/2003

OTHER PUBLICATIONS

Bhatnagar et al. IEEE Transaction on Electron Devices, vol. 40, No. 3, 1993, p. 645.*
David C. Sheridan, et al., "Design of single and multiple zone junction termination extension structures for SiC power devices", pp. 1659-1664, vol. 45, 2001.

* cited by examiner

*Primary Examiner*—Thanh V Pham
*Assistant Examiner*—Jami M Valentine
(74) *Attorney, Agent, or Firm*—Oblon, Spivak, McClelland, Maier & Neustadt, P.C.

(57) ABSTRACT

A semiconductor device includes an anode electrode in Schottky contact with an n-type drift layer formed in an SiC substrate and a JTE region formed outside the anode electrode. The JTE region is made up of a first p-type zone formed in an upper portion of the drift layer under an edge of the anode electrode and a second p-type zone formed outside the first p-type zone having a lower surface impurity concentration than the first p-type zone. The second p-type zone is provided 15 μm or more outwardly away from the edge of the anode electrode. The surface impurity concentration of the first p-type zone ranges from $1.8 \times 10^{13}$ to $4 \times 10^{13}$ cm$^{-2}$, and that of the second p-type zone ranges from $1 \times 10^{13}$ to $2.5 \times 10^{13}$ cm$^{-2}$.

5 Claims, 6 Drawing Sheets

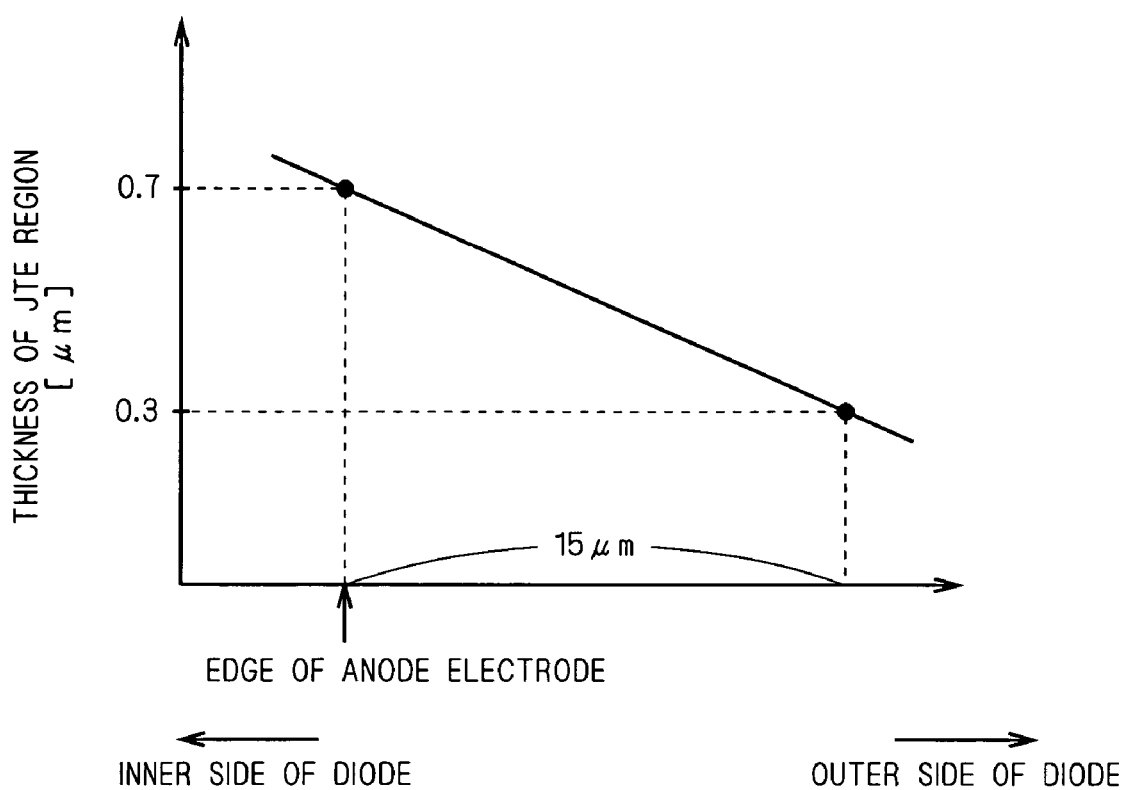

SEMICONDUCTOR DEVICE HAVING JUNCTION TERMINATION EXTENSION

BACKGROUND OF THE INVENTION

1. Field of the Invention

The present invention relates to a structure of a semiconductor device, and more particularly, to an edge termination of a semiconductor device having a Schottky electrode.

2. Description of the Background Art

Semiconductor devices with silicon carbide used as a base material are known for their excellent temperature characteristics and breakdown voltage characteristics. However, SiC semiconductor manufacturing technology has many difficulties to overcome, and many of them are encountered particularly in devices intended for use in high-voltage applications. For instance, one of such problems to be solved is to produce a proper edge termination around a Schottky barrier diode with SiC used as a base material. As the electric field normally reaches its peak in the vicinity of the outer edge of a Schottky electrode (hereinafter referred to as "electric field concentration"), an edge termination that can reduce the electric field concentration at and around the edge is required.

Known as an edge termination for a Schottky barrier diode formed on an SiC substrate is a Junction Termination Extension (JTE) in which the charge level of a region of p-type conductivity provided around a Schottky electrode on the SiC substrate is decreasing stepwise in an outward direction from the diode (e.g., U.S. Pat. No. 5,914,500).

In the JTE, a plurality of zones of different impurity concentrations or thicknesses need to be provided such that the charge level of the above p-type region (hereinafter referred to as a "JTE region") is decreasing stepwise outwardly from the device. That is, the JTE region is made up of a plurality of p-type zones having different charge levels. Therefore, a great number of steps is required to form the JTE region, which contributes to interference with reduction in manufacturing costs.

As described above, the electric field concentration is likely to occur in the vicinity of the edge of a Schottky electrode. This requires proper setting of concentration and thickness of the JTE region in a position where the JTE region is in contact with the Schottky electrode; otherwise, the electric field concentration at the edge of the Schottky electrode is not sufficiently relieved, resulting in an increase in the tunneling current at the edge of the Schottky electrode, which makes it impossible to obtain a breakdown voltage close to an ideal breakdown voltage. Further, the electric field concentration also occurs at the border between a plurality of p-type zones making up the JTE region, that is, in a position where the charge level abruptly changes, which contributes to degradation in breakdown voltage characteristics of the JTE region.

SUMMARY OF THE INVENTION

It is an object of the present invention to provide a semiconductor device having a JTE capable of being formed easily and achieving sufficient breakdown voltage characteristics as well as a semiconductor device having a JTE capable of suppressing the occurrence of electric field concentration inside thereof.

The semiconductor device according to the present invention includes a semiconductor substrate, an n-type drift layer formed in the semiconductor substrate, an electrode formed on the semiconductor substrate, and a p-type Junction Termination Extension region formed in an upper portion of the n-type drift layer. The electrode comes into Schottky contact with the n-type drift layer. The JTE region extends under an edge of the electrode which is in contact with the semiconductor substrate.

According to a first aspect of the invention, the JTE region includes a first p-type zone connected to the edge, and a second p-type zone formed outside the first p-type zone, having a lower surface impurity concentration than the first p-type zone. The second p-type zone is provided 15 µm or more outwardly away from the edge. The first p-type zone has a surface impurity concentration ranging from $1.8 \times 10^{13}$ to $4 \times 10^{13}$ cm$^{-2}$. The second p-type zone has a surface impurity concentration ranging from $1 \times 10^{13}$ to $2.5 \times 10^{13}$ cm$^{-2}$.

The JTE region has a simple structure made up of the two, that is, first and second p-type zones, and thus can be formed in a smaller number of steps than a conventional JTE. This contributes to simplified manufacturing steps and reduced manufacturing costs. In addition, since the surface impurity concentration of the first p-type zone ranges from $1.8 \times 10^{13}$ to $4 \times 10^{13}$ cm$^{-2}$ and that of the second p-type zone ranges from $1 \times 10^{13}$ to $2.5 \times 10^{13}$ cm$^{-2}$, the occurrence of electric field concentration in the JTE region is suppressed. Therefore, the semiconductor device has improved breakdown voltage characteristics.

According to a second aspect of the invention, the JTE region has a surface impurity concentration continuously decreasing outwardly from the edge. The surface impurity concentration ranges from $1.8 \times 10^{13}$ to $4 \times 10^{13}$ cm$^{-2}$ under the edge and ranges from $1 \times 10^{13}$ to $2.5 \times 10^{13}$ cm$^{-2}$ in a position 15 µm outwardly away from the edge.

Since the surface impurity concentration in the JTE region ranges from $1.8 \times 10^{13}$ to $4 \times 10^{13}$ cm$^{-2}$ under the edge of the electrode and ranges from $1 \times 10^{13}$ to $2.5 \times 10^{13}$ cm$^{-2}$ in a position 15 µm away from the edge, the occurrence of electric field concentration in the JTE region is suppressed. Therefore, the semiconductor device has improved breakdown voltage characteristics. In addition, since the JTE region has a continuously decreasing surface impurity concentration outwardly from under the edge of the electrode, the occurrence of electric field concentration in the JTE region is suppressed, allowing the electric field distribution to become flattened. Therefore, the JTE region has more improved breakdown voltage characteristics.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a graph showing the thickness distribution of a JTE region according to the fourth preferred embodiment.

DESCRIPTION OF THE PREFERRED EMBODIMENTS

First Preferred Embodiment

Figure 1:
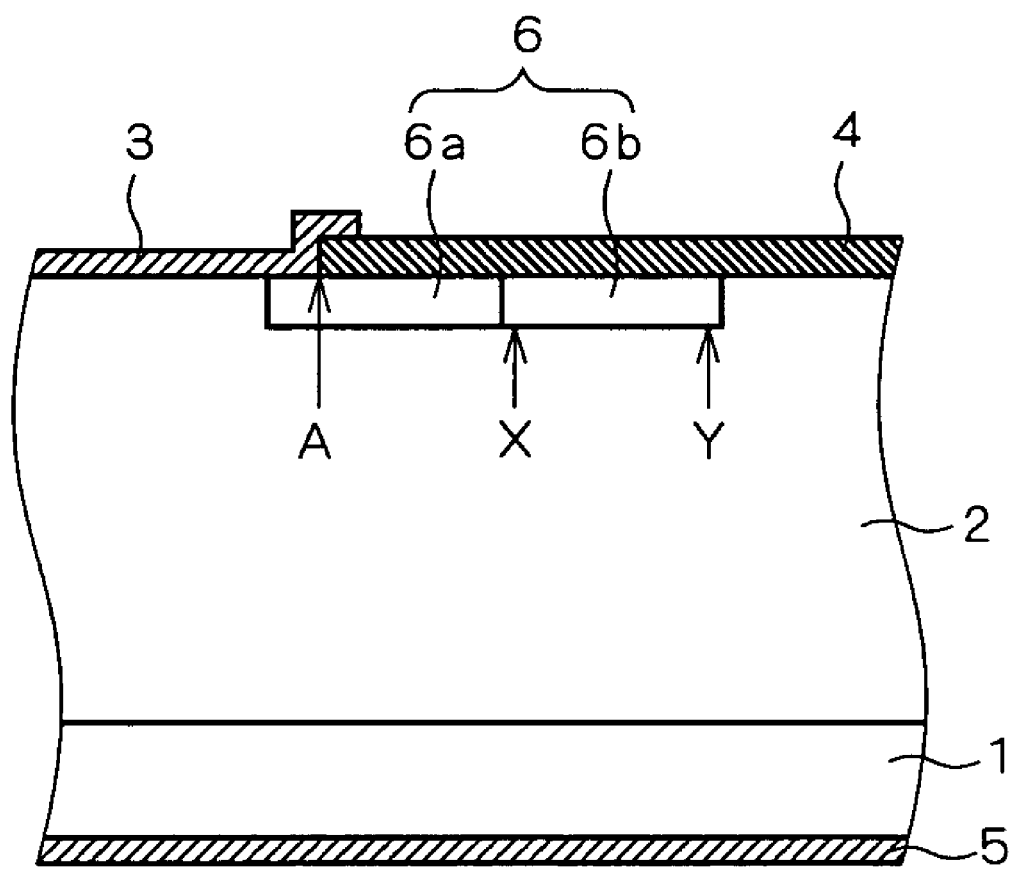
FIG. 1 is a sectional view showing the structure of a semiconductor device according to a first preferred embodiment of the present invention.

FIG. 1 is a sectional view showing the structure of a semiconductor device according to a first preferred embodiment of the present invention. The semiconductor device is provided with a Schottky barrier diode formed on an SiC substrate 1. More specifically, an n-type SiC drift layer 2 is formed in the n-type SiC substrate 1, and an anode electrode 3 (Schottky electrode) is formed on the upper surface of the SiC drift layer 2 to come into Schottky contact with the drift layer 2. The drift layer 2 is set to have an impurity concentration (doping) of $2 \times 10^{15}$ to $12 \times 10^{15}$ cm$^{-3}$ and a thickness of 5 to 15 μm such that the diode can achieve a breakdown voltage of about 1000 V. An insulating film 4 is also formed on the upper surface of the drift layer 2 in a region which does not come into contact with the anode electrode 3. A cathode electrode 5 of the diode is provided on the bottom of the SiC substrate 1.

A JTE region 6 is formed as an edge termination outside the anode electrode 3 in the upper portion the drift layer 2. More specifically, the JTE region 6 is formed under an edge of the anode electrode 3 which is in contact with the SiC substrate 1. In the following description, "the edge of the anode electrode 3" shall indicate "the edge of the anode electrode 3 which is in contact with the SiC substrate 1" (i.e., point A shown in FIG. 1).

In the present embodiment, the JTE region 6 is made up of two p-type zones: a first p-type zone 6a; and a second p-type zone 6b, as shown in FIG. 1. The first p-type zone 6a is formed in the upper portion of the drift layer 2 so as to come into contact with the edge of the anode electrode 3. The first p-type zone 6a can be formed to reach 5 μm or more inwardly away from the edge of the anode electrode 3 and to reach 15 μm or more outwardly away from the edge.

The second p-type zone 6b has a charge level lower than that of the first p-type zone 6a, and is formed outside the first p-type zone 6a in the upper portion of the drift layer 2. The second p-type zone 6b can be formed to reach 15 μm or more outwardly away from the border with the first p-type zone 6a.

Now, "surface impurity concentration (cm$^{-2}$)" is introduced as a concept of representing a charge level of an impurity region. The surface impurity concentration is obtained by multiplying the impurity concentration (cm$^{-3}$) per unit volume of an impurity region by the thickness of the impurity region. It can be said that, the charge level increases as the surface impurity concentration increases. The "impurity concentration" in the following description shall indicate the concentration per unit volume.

Inventors of the present invention simulated the diode constructed as shown in FIG. 1 in terms of changes in the electric field distribution while changing the charge level (surface impurity concentration) of the first and second p-type zones 6a and 6b, respectively, to study proper surface impurity concentration for each of the first and second p-type zones 6a and 6b. The results of simulation are shown in FIGS. 2 and 3.

Figure 2:
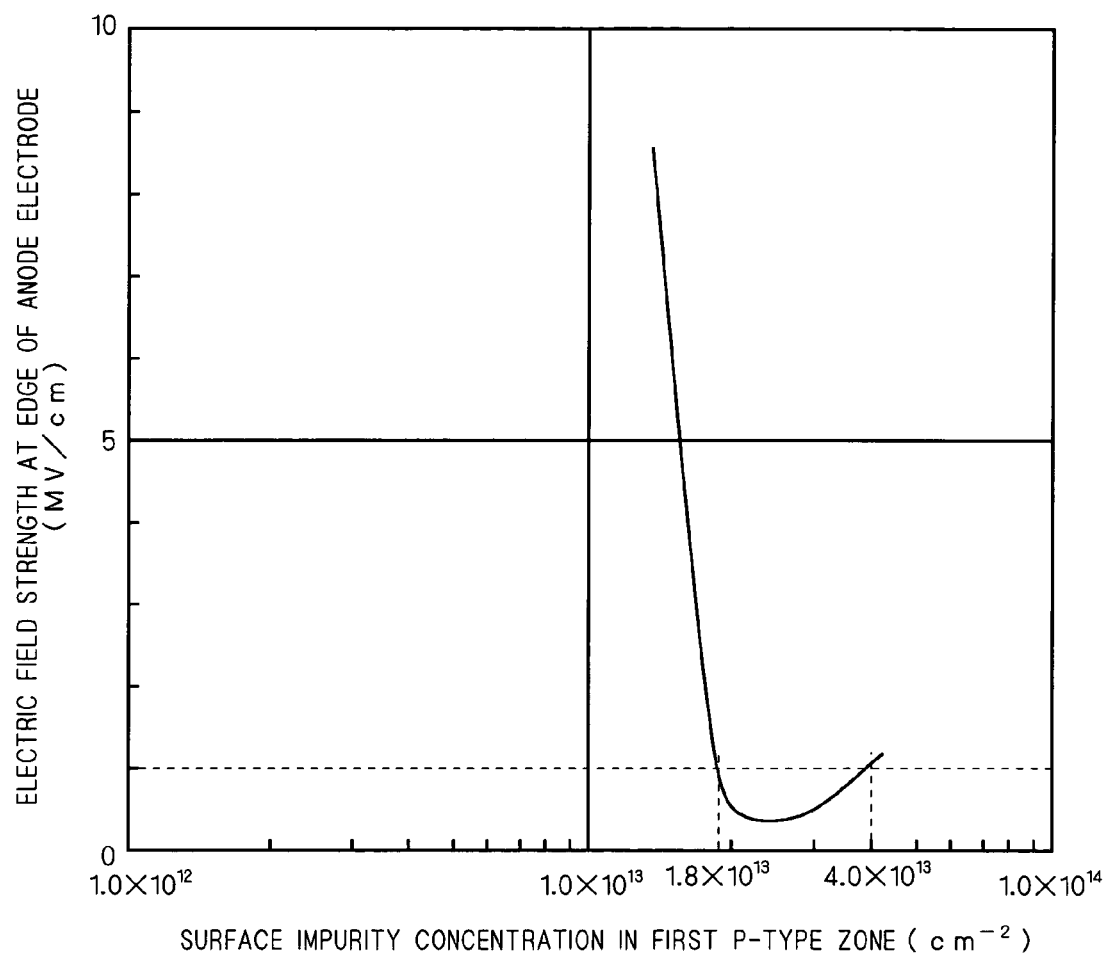
FIGS. 2 and 3 are graphs each showing the result of simulation for describing the effects achieved by the first preferred embodiment.

FIG. 2 shows the relationship between the surface impurity concentration under the edge of the anode electrode 3 in the JTE region 6 and the electric field strength at the edge when a reverse voltage of 1000 V is applied to the diode constructed as shown in FIG. 1. Normally, the electric field reaches its peak under the edge of the anode electrode 3. The results of simulation reveal that the peak of electric field remains at 1 MV/cm or lower when the surface impurity concentration of the first p-type zone 6a ranges from $1.8 \times 10^{13}$ to $4 \times 10^{13}$ cm$^{-2}$.

Figure 3:
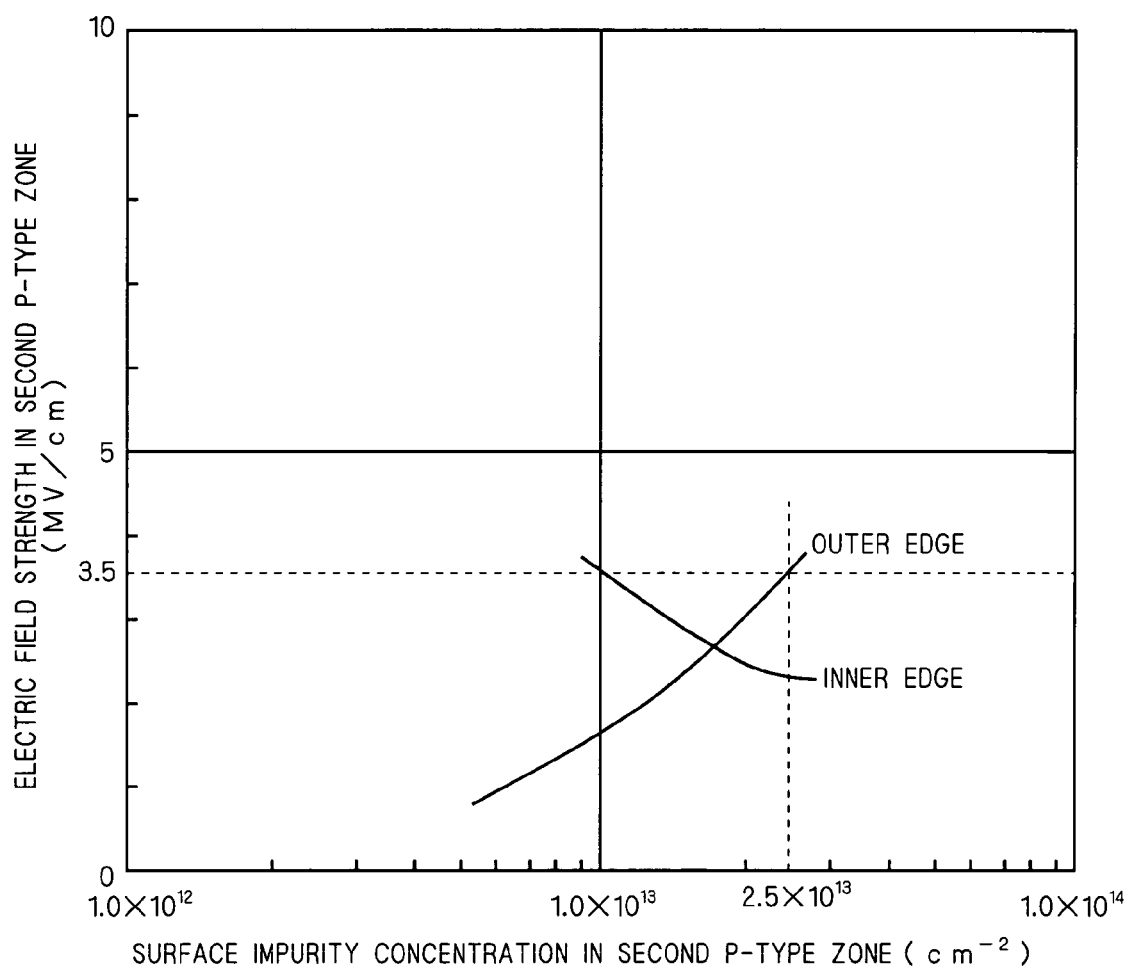

FIG. 3 shows the relationship between the surface impurity concentration of the second p-type zone 6b and each of the electric field strength at an inner edge of the second p-type zone 6b (i.e., the border with the first p-type zone 6a; point X in FIG. 1) and the electric field strength at an outer edge (point Y in FIG. 1) when a reverse voltage of 1000 V is applied to the diode constructed as shown in FIG. 1. In the JTE region 6 shown in FIG. 1, the electric field normally reaches its peak at two points (i.e., the inner and outer edges of the second p-type zone 6b). The peak at the inner edge of the second p-type zone 6b increases as shown in FIG. 3 as the surface impurity concentration of the second p-type zone 6b decreases, while the peak at the outer edge increases as the surface impurity concentration increases. The results of simulation reveal that the two peaks both remain at 3.5 MV/cm or lower when the surface impurity concentration of the second p-type zone 6b ranges from $1 \times 10^{13}$ to $2.5 \times 10^{13}$ cm$^{-2}$.

Accordingly, the surface impurity concentration of the first p-type zone 6a is set at $1.8 \times 10^{13}$ to $4 \times 10^{13}$ cm$^{-2}$ and that of the second p-type zone 6b is set at $1 \times 10^{13}$ to $2.5 \times 10^{13}$ cm$^{-2}$. The surface impurity concentration of the second p-type zone 6b is set lower than that of the first p-type zone 6a.

For instance, the first and second p-type zones 6a and 6b may both be set at 0.7 μm in thickness, and the impurity concentration of the first p-type zone 6a may be set at $5 \times 10^{17}$ cm$^{-3}$ while that of the second p-type zone 6b may be set at $2 \times 10^{17}$ cm$^{-3}$. In this case, the surface impurity concentration of the first p-type zone 6a becomes $3.5 \times 10^{13}$ cm$^{-2}$ and that of the second p-type zone 6b becomes $1.4 \times 10^{13}$ cm$^{-2}$.

As is apparent from the results of simulation shown in FIGS. 2 and 3, forming the JTE region 6 by the first p-type zone 6a having a surface impurity concentration ranging from $1.8 \times 10^{13}$ to $4 \times 10^{13}$ cm$^{-2}$ and the second p-type zone 6b having a surface impurity concentration ranging from $1 \times 10^{13}$ to $2.5 \times 10^{13}$ cm$^{-2}$ allows the peak of electric field under the edge of the anode electrode 3 to remain at 1 MV/cm or lower even when a voltage of about 1000 V, for example, is applied to the diode. This suppresses an increase in the tunneling current along with the electric field concentration under the edge of the anode electrode 3, which can avoid the occurrence of a voltage breakdown. Additionally, the peaks of electric field at the inner and outer edges of the second p-type zone 6b both remain at 3.5 MV/cm or lower, so that the electric field distribution in the JTE region 6 becomes flattened. That is, a high electric field is prevented from occurring in a specific portion of the JTE region 6. A yield point at which avalanche breakdown occurs therefore approaches the anode electrode 3, causing a voltage breakdown to occur stably and reversibly. As a result, the diode according to the present embodiment can achieve a breakdown voltage close to an ideal breakdown voltage.

As described above, the JTE region 6 of the present embodiment has a simple structure made up of the two, i.e., first and second p-type zones 6a and 6b. Thus, it can be formed in a smaller number of steps than a conventional JTE, which contributes to simplified manufacturing steps and reduced manufacturing costs. In addition, the surface impurity concentration of the first p-type zone 6a is set at $1.8 \times 10^{13}$ to $4 \times 10^{13}$ cm$^{-2}$ and that of the second p-type zone 6b is set at $1 \times 10^{13}$ to $2.5 \times 10^{13}$ cm$^{-2}$, which suppresses the occurrence of electric field concentration. Therefore, the semiconductor device has improved breakdown voltage characteristics.

Although the anode electrode 3 partly extends over the upper surface of the insulating film 4 as shown in FIG. 1, the application of the present invention is not limited to the anode electrode 3 of such shape. That is, the anode electrode 3 may be formed not to extend over the insulating film 4 (which means the entire bottom surface of the anode electrode 3 comes into contact with the SiC substrate 1).

Second Preferred Embodiment

In the first preferred embodiment, the first and second p-type zones 6a and 6b are formed in the same thickness as shown in FIG. 1. Then, the surface impurity concentration of the first p-type zone 6a is set at $1.8 \times 10^{13}$ to $4 \times 10^{13}$ cm$^{-2}$ and that of the second p-type zone 6b is set at $1 \times 10^{13}$ to $2.5 \times 10^{13}$ cm$^{-2}$ by adjusting the impurity concentration of respective zones.

As described earlier, however, the surface impurity concentration is obtained by multiplying the impurity concentration of an impurity region by the thickness of the impurity region. Accordingly, the surface impurity concentration can also be adjusted by adjusting the thickness of the impurity region.

Figure 4:
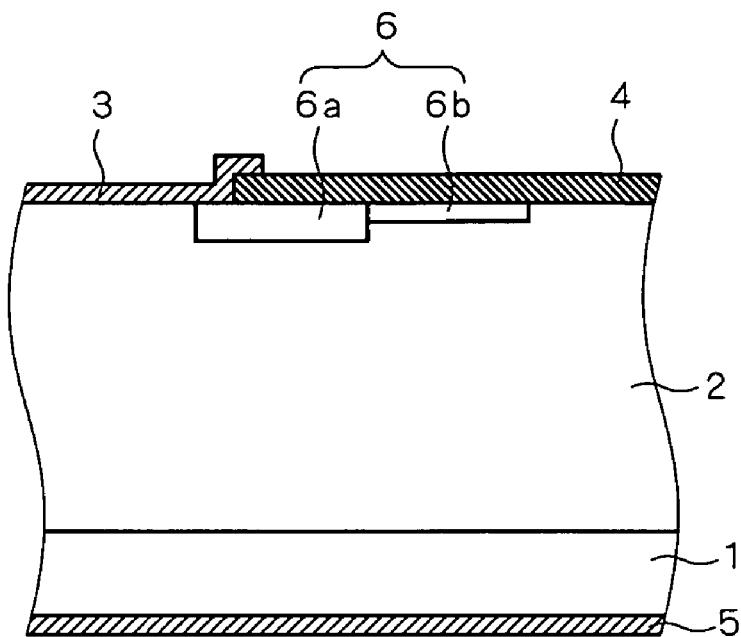
FIG. 4 is a sectional view showing the structure of a semiconductor device according to a second preferred embodiment of the invention.

FIG. 4 is a sectional view showing the structure of a semiconductor device according to a second preferred embodiment of the invention. In this drawing, components similar to those shown in FIG. 1 are indicated by the same reference characters, and detailed description thereof is thus omitted here.

In the present embodiment, setting the first and second p-type zones 6a and 6b to have the same impurity concentration and different thicknesses, the surface impurity concentration of the first p-type zone 6a is set at $1.8 \times 10^{13}$ to $4 \times 10^{13}$ cm$^{-2}$, and that of the second p-type zone 6b is set at $1 \times 10^{13}$ to $2.5 \times 10^{13}$ cm$^{-2}$.

For instance, the impurity concentration of each of the first and second p-type zones 6a and 6b is set at $5 \times 10^{17}$ cm$^{-3}$. Then, as shown in FIG. 4, the first and second p-type zones 6a and 6b are formed in different thicknesses. For instance, the first p-type zone 6a is set at 0.7 μm in thickness, and the second p-type zone 6b is set at 0.3 μm in thickness. Accordingly, the surface impurity concentration of the first p-type zone 6a becomes $3.5 \times 10^{13}$ cm$^{-2}$, and that of the second p-type zone 6b becomes $1.5 \times 10^{13}$ cm$^{-2}$.

In the present embodiment, the surface impurity concentration of the first p-type zone 6a also ranges from $1.8 \times 10^{13}$ to $4 \times 10^{13}$ cm$^{-2}$ and that of the second p-type zone 6b also ranges from $1 \times 10^{13}$ to $2.5 \times 10^{13}$ cm$^{-2}$, which suppresses the occurrence of electric field concentration, similarly to the first preferred embodiment. Therefore, the semiconductor device has improved breakdown voltage characteristics. Moreover, the JTE region 6 is made up of the two p-type zones in the present embodiment as well, which can be formed in a small number of steps, similarly to the first preferred embodiment.

Third Preferred Embodiment

In the conventional JTE, as described earlier, the electric field concentration occurs at the border between a plurality of p-type zones making up the JTE region, i.e., a position in which the charge level abruptly changes in the JTE region. In the present embodiment, a JTE capable of suppressing the occurrence of electric field concentration in a JTE region will be described.

Figure 5:
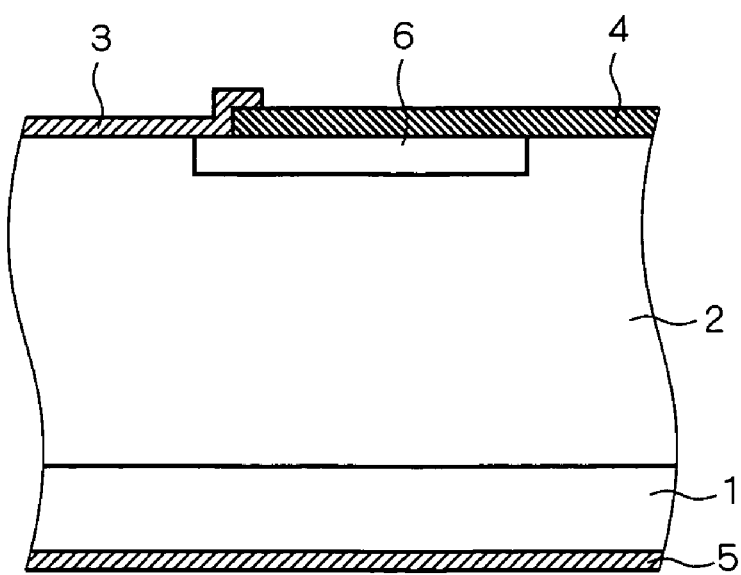
FIG. 5 is a sectional view showing the structure of a semiconductor device according to a third preferred embodiment of the invention.

FIG. 5 is a sectional view showing the structure of a semiconductor device according to a third preferred embodiment of the invention. In this drawing, components similar to those shown in FIG. 1 are indicated by the same reference characters.

The p-type zones making up the JTE region 6 are formed to extend under the edge of the anode electrode 3 and to reach 20 μm or more outwardly away from the edge. In the present embodiment, the JTE region 6 has a constant thickness as shown in FIG. 5, and a continuously decreasing impurity concentration outwardly from the edge of the anode electrode 3. In this case, the surface impurity concentration under the edge of the anode electrode 3 is set at $1.8 \times 10^{13}$ to $4 \times 10^{13}$ cm$^{-2}$, and that in a position 15 μm away from the edge of the anode electrode 3 is set at $1 \times 10^{13}$ to $2.5 \times 10^{13}$ cm$^{-2}$.

Figure 6:
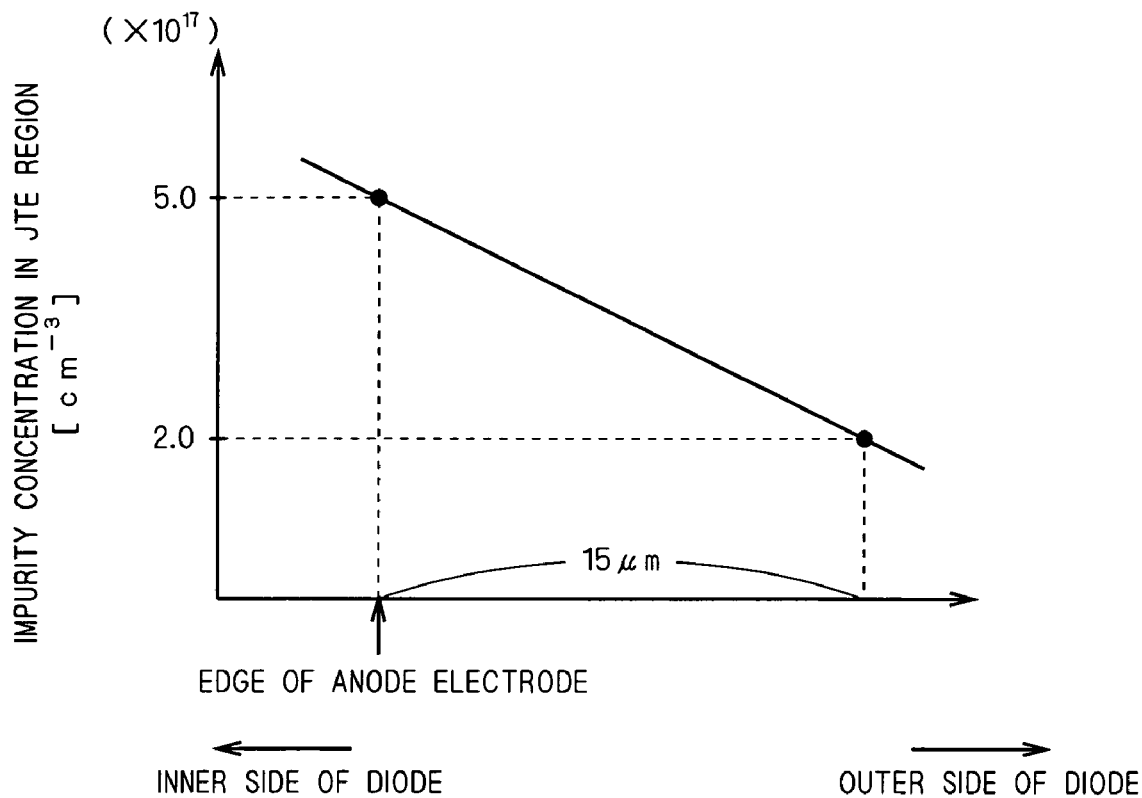
FIG. 6 is a graph showing the impurity concentration distribution in a JTE region according to the third preferred embodiment.

For instance, the JTE region 6 may be set at 0.7 μm in thickness, and the impurity concentration in the JTE region 6 may continuously be changed so as to become $5 \times 10^{17}$ cm$^{-3}$ under the edge of the anode electrode 3 and to reach $2 \times 10^{17}$ cm$^{-3}$ in the position 15 μm away from the edge. That is, the impurity concentration distribution in the JTE region 6 shall be changed as shown in the graph of FIG. 6. Accordingly, the surface impurity concentration in the JTE region 6 becomes $3.5 \times 10^{13}$ cm$^{-2}$ under the edge of the anode electrode 3 and $1.4 \times 10^{13}$ cm$^{-2}$ in the position 15 μm away from the edge.

Setting the surface impurity concentration in the JTE region 6 at $1.8 \times 10^{13}$ to $4 \times 10^{13}$ cm$^{-2}$ under the edge of the anode electrode 3 and that in the position 15 μm away from the edge at $1 \times 10^{13}$ to $2.5 \times 10^{13}$ cm$^{-2}$ makes the distribution of surface impurity concentration of the JTE region 6 similar to that obtained in the first preferred embodiment. Therefore, similarly to the first preferred embodiment, the occurrence of electric field concentration is suppressed, and the semiconductor device has improved breakdown voltage characteristics.

Further, in the present embodiment, the JTE region 6 has a constant thickness and a continuously decreasing impurity concentration outwardly from under the edge of the anode electrode 3. Thus, the surface impurity concentration in the JTE region 6 continuously decreases outwardly from under the edge of the anode electrode 3. That is, the surface impurity concentration does not change abruptly anywhere in the JTE region 6. Accordingly, the occurrence of electric field concentration in the JTE region 6 is suppressed, allowing the electric field distribution to be flattened. Therefore, the JTE region 6 has more improved breakdown voltage characteristics.

Fourth Preferred Embodiment

Figure 7:
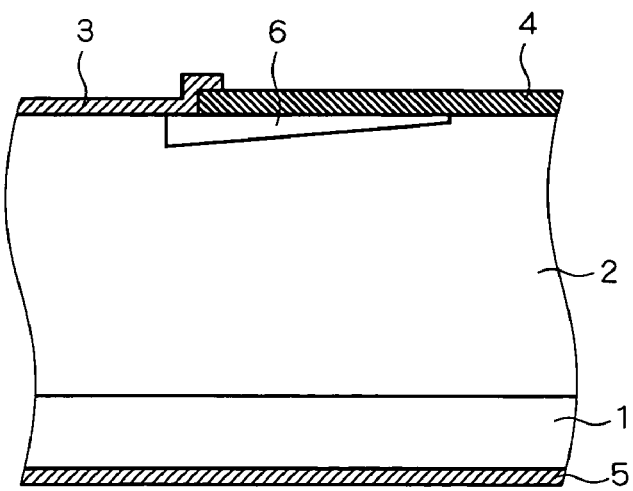
FIG. 7 is a sectional view showing the structure of a semiconductor device according to a fourth preferred embodiment of the invention.

FIG. 7 is a sectional view showing the structure of a semiconductor device according to a fourth preferred embodiment of the invention. In this drawing, components similar to those shown in FIG. 1 are indicated by the same reference characters.

The p-type zones making up the JTE region 6 are formed to extend under the edge of the anode electrode 3 and to reach 20 μm or more outwardly away from the edge. In the present embodiment, the JTE region 6 has a constant impurity concentration, and as shown in FIG. 7, the JTE region 6 is formed to continuously decrease in thickness outwardly from the edge of the anode electrode 3. In this case, the surface impurity concentration under the edge of the anode electrode 3 is set at $1.8 \times 10^{13}$ to $4 \times 10^{13}$ cm$^{-2}$, and that in a position 15 μm away from the edge of the anode electrode 3 is set at $1 \times 10^{13}$ to $2.5 \times 10^{13}$ cm$^{-2}$.

For instance, the impurity concentration in the JTE region 6 may be set at $5 \times 10^{17}$ cm$^{-3}$, and the JTE region 6 may continuously be changed in thickness so as to be 0.7 μm under the edge of the anode electrode 3 and 0.3 μm in the position 15 μm away from the edge. That is, the thickness of the JTE region 6 shall be distributed as shown in the graph of FIG. 8. Accordingly, the surface impurity concentration in the JTE region 6 becomes $3.5 \times 10^{13}$ cm$^{-2}$ under the edge of the anode electrode 3 and $1.5 \times 10^{13}$ cm$^{-2}$ in the position 15 μm away from the edge.

Setting the surface impurity concentration in the JTE region 6 at $1.8 \times 10^{13}$ to $4 \times 10^{13}$ cm$^{-2}$ under the edge of the anode electrode 3 and at $1 \times 10^{13}$ to $2.5 \times 10^{13}$ cm$^{-2}$ in the position 15 μm away from the edge makes the distribution of surface impurity concentration of the JTE region 6 similar to that obtained in the first preferred embodiment. Therefore, similarly to the first preferred embodiment, the occurrence of electric field concentration is suppressed, and the semiconductor device has improved breakdown voltage characteristics.

Further, in the present embodiment, the JTE region 6 has a constant impurity concentration and a continuously decreasing thickness outwardly from under the edge of the anode electrode 3. Thus, the surface impurity concentration in the JTE region 6 continuously decreases outwardly from under the edge of the anode electrode 3. That is, the surface impurity concentration does not change abruptly anywhere in the JTE region 6. Accordingly, the occurrence of electric field concentration in the JTE region 6 is suppressed, allowing the electric field distribution to be flattened. Therefore, the JTE region 6 has more improved breakdown voltage characteristics.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a semiconductor substrate;
   an n-type SiC drift layer formed in said semiconductor substrate;
   an electrode formed on said semiconductor substrate to come into Schottky contact with said n-type SiC drift layer; and
   a p-type Junction Termination Extension region formed in an upper portion of said n-type SiC drift layer under an edge of said electrode which is in contact with said semiconductor substrate, wherein
   said Junction Termination Extension region consisting only of:
   a first p-type zone connected to said edge; and
   a second p-type zone formed outside said first p-type zone, having a lower charge level than said first p-type zone,
   said second p-type zone being provided 15 μm or more outwardly away from said edge,
   said first p-type zone has a charge level ranging from $1.8 \times 10^{13}$ to $4 \times 10^{13}$ cm$^{-2}$, and
   said second p-type zone has a charge level ranging from $1 \times 10^{13}$ to $2.5 \times 10^{13}$ cm$^{-2}$.

2. The semiconductor device according to claim 1, wherein said first and second p-type zones have the same thickness, and
   said second p-type zone has a lower impurity concentration per unit volume than said first p-type zone.

3. The semiconductor device according to claim 1, wherein said first and second p-type zones have the same impurity concentration per unit volume, and
   said second p-type zone is thinner than said first p-type zone.

4. A semiconductor device comprising:
   a semiconductor substrate;
   an n-type SiC drift layer formed in said semiconductor substrate;
   an electrode formed on said semiconductor substrate to come into Schottky contact with said n-type SiC drift layer; and
   a p-type Junction Termination Extension region formed in an upper portion of said n-type SiC drift layer under an edge of said electrode which is in contact with said semiconductor substrate, wherein
   said Junction Termination Extension region has a charge level continuously decreasing outwardly from said edge, said charge level ranging from $1.8 \times 10^{13}$ to $4 \times 10^{13}$ cm$^{-2}$ under said edge and ranging from $1 \times 10^{13}$ to $2.5 \times 10^{13}$ cm$^{-2}$ in a position 15 μm outwardly away from said edge, and
   said Junction Termination Extension region has a constant thickness and an impurity concentration per unit volume continuously decreasing outwardly from said edge.

5. A semiconductor device comprising:
   a semiconductor substrate;
   an n-type SiC drift layer formed in said semiconductor substrate;
   an electrode formed on said semiconductor substrate to come into Schottky contact with said n-type SiC drift layer; and
   a p-type Junction Termination Extension region formed in an upper portion of said n-type SiC drift layer under an edge of said electrode which is in contact with said semiconductor substrate, wherein
   said Junction Termination Extension region has a charge level continuously decreasing outwardly from said edge, said charge level ranging from $1.8 \times 10^{13}$ to $4 \times 10^{13}$ cm$^{-2}$ under said edge and ranging from $1 \times 10^{13}$ to $2.5 \times 10^{13}$ cm$^{-2}$ in a position 15 μm outwardly away from said edge, and
   said Junction Termination Extension region has a constant impurity concentration per unit volume and a thickness continuously decreasing outwardly from said edge.

* * * * *